(12) United States Patent
Lee et al.

(10) Patent No.: US 12,237,018 B2
(45) Date of Patent: *Feb. 25, 2025

(54) MEMORY SUB-SYSTEM SANITIZATION

(71) Applicant: Micron Technology, Inc., Boise, ID (US)

(72) Inventors: Eric N. Lee, San Jose, CA (US);
Robert W. Strong, Folsom, CA (US);
William Akin, Morgan Hill, CA (US);
Jeremy Binfet, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/386,919

(22) Filed: Nov. 3, 2023

(65) Prior Publication Data
US 2024/0062828 A1 Feb. 22, 2024

Related U.S. Application Data

(63) Continuation of application No. 17/458,795, filed on Aug. 27, 2021, now Pat. No. 11,810,621.

(51) Int. Cl.
*G11C 11/34* (2006.01)
*G11C 16/10* (2006.01)
*G11C 16/16* (2006.01)
*G11C 16/26* (2006.01)
*G11C 16/30* (2006.01)

(52) U.S. Cl.
CPC .......... *G11C 16/16* (2013.01); *G11C 16/102* (2013.01); *G11C 16/26* (2013.01); *G11C 16/30* (2013.01)

(58) Field of Classification Search
CPC ......... G11C 16/10; G11C 16/30; G11C 16/12; G11C 16/0483; H01L 17/115
USPC .......................... 365/185.18, 185.29, 185.19
See application file for complete search history.

(56) References Cited

U.S. PATENT DOCUMENTS

| | | | |
|---|---|---|---|
| 8,705,291 B2 | 4/2014 | Goss et al. | |
| 11,810,621 B2* | 11/2023 | Lee | G11C 16/22 |
| 2009/0172251 A1 | 7/2009 | Norman | |
| 2014/0231954 A1 | 8/2014 | Lue | |
| 2016/0179386 A1 | 6/2016 | Zhang | |
| 2019/0087110 A1* | 3/2019 | Li | G11C 16/08 |

FOREIGN PATENT DOCUMENTS

WO 2017074570 5/2017

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

* cited by examiner

*Primary Examiner* — Son T Dinh
(74) *Attorney, Agent, or Firm* — Brooks, Cameron & Huebsch, PLLC

(57) ABSTRACT

A method includes receiving signaling indicative of performance of a sanitization operation to a processing device coupled to a memory device and applying a sanitization voltage to a plurality of memory blocks of the memory device. The sanitization voltage can be greater than an erase voltage of the plurality of memory blocks.

20 Claims, 4 Drawing Sheets

MEMORY SUB-SYSTEM SANITIZATION

PRIORITY INFORMATION

This application is a continuation of U.S. application Ser. No. 17/458,795, filed on Aug. 27, 2021, which issues as U.S. Pat. No. 11,810,621 on Nov. 7, 2023, the contents of which are incorporated herein by reference.

TECHNICAL FIELD

Embodiments of the disclosure relate generally to memory sub-systems, and more specifically, relate to memory sub-system sanitization.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
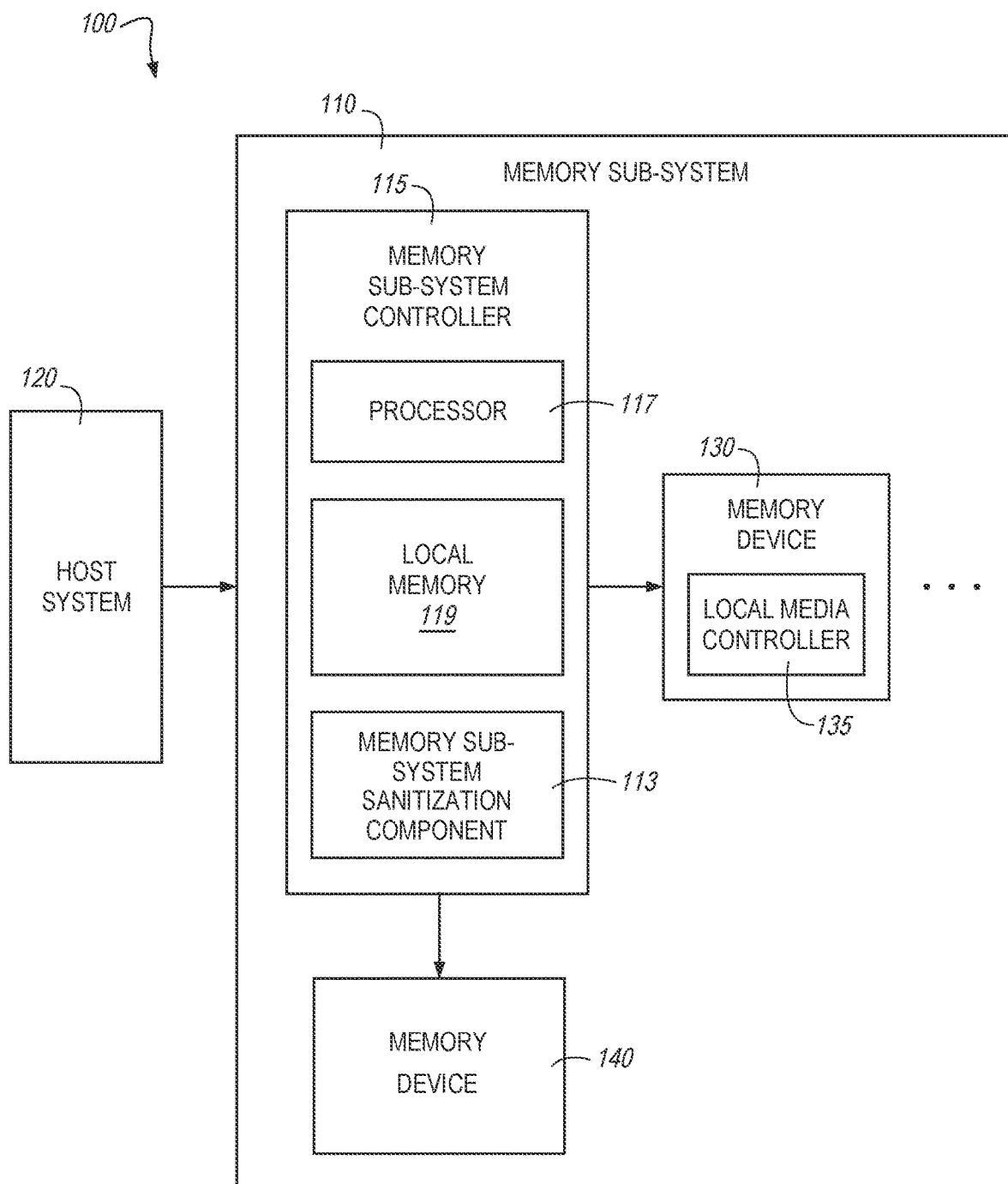
FIG. 1 illustrates an example computing system that includes a memory sub-system in accordance with some embodiments of the present disclosure.

Aspects of the present disclosure are directed to memory sub-system sanitization, in particular to memory sub-systems that include a memory sub-sanitization component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more die. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MHLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Instances of preventing access to data that has been written to memory device can occur. For example, preventing access to data (e.g., personal and/or confidential data) that has been written to memory device may be desirable so that a memory sub-system can be returned, repurposed, and/or discarded.

Some approaches to preventing access to data that has been written to memory device have utilized a secure erase procedure. Secure erase procedures can delete the mapping table for a drive. However, secure erase procedures do not delete data from the blocks that have been written. As such, accessing the data subsequent to the secure erase procedure can be possible utilizing a data recovery procedure.

Some other approaches to preventing access to data that has been written to a memory device have utilized a block-by-block erase. For a block-by-block erase, deletion of the blocks that have been written on can be accomplished. However, block-by-block erases utilize a sequential erase (i.e., block-by-block) that can be associated with an erase latency that is multiplied by the number of blocks being erased. This erase latency can reduce performance (e.g., as in increased number of clock cycles and/or increased time interval to achieve erase of the memory device).

Additionally, a block-by-block erase can utilize a block-by-block erase voltage that is applied sequentially and repeatedly (e.g., a block-by-block erase voltage is applied two or more times to each block) to the blocks to ensure that the blocks are erased. These repeated applications of a block-by-block erase voltage are repeated operations that can reduce performance (e.g., as in an increased aggregate power consumption to achieve erase of the memory device).

Further, a block-by-block erase can utilize a significant amount of power (e.g., provide a poor power consumption performance). The poor power consumption performance can result from sequential applications of a block-by-block erase voltage to the various blocks being erased, as well as from the time required to apply block-by-block erase voltage sequentially and in repeated applications.

Aspects of the present disclosure address the above and other deficiencies by applying a sanitization voltage to a plurality of memory blocks of a memory device. Application of the sanitization voltage can be used to sanitize a plurality of memory blocks of a memory device. As used herein, "sanitization" and/or "sanitize" describe a process where data is irretrievably removed from a storage device such that it is not possible to forensically (or otherwise) reconstruct it.

A single application of the sanitization voltage to each of the plurality of memory blocks of a memory device can ensure that each of the plurality of memory blocks is sanitized (e.g., each of the blocks is erased thereby preventing access to data that has been written to the memory device). Embodiments provide that the sanitization voltage is applied in parallel to each of a plurality of memory blocks of a memory device. As the single application of the sanitization voltage to each of the plurality of memory is utilized, and the single application of the sanitization voltage is applied in parallel, improved performance in comparison to the approaches described above can be realized.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a sanitization component 113. Although not shown in FIG. 1 so as to not obfuscate the drawings, the sanitization component 113 can include various circuitry to facilitate receiving signaling indicative of performance of a sanitization operation (e.g., receiving a sanitization command) for a memory sub-system and/or components of the memory sub-system, and applying a sanitization voltage to a plurality of memory blocks, wherein the sanitization voltage is greater (e.g., a greater magnitude) than an erase voltage of the plurality of memory blocks. In some embodiments, the sanitization component 113 can include special purpose circuitry in the form of an ASIC, FPGA, state machine, and/or other logic circuitry that can allow the sanitization component 113 to orchestrate and/or perform operations to selectively perform sanitization operations for the memory device 130 and/or the memory device 140 based on receiving signaling indicative of performance of a sanitization operation. While not shown in FIG. 1, one or more embodiments provide that the sanitization component is located, entirely or a portion thereof, on a memory device (e.g., memory device 130 and/or memory device 140) of the memory sub-system 110.

In some embodiments, the memory sub-system controller 115 includes at least a portion of the sanitization component 113. For example, the memory sub-system controller 115 can include a processor 117 (processing device) configured to execute instructions stored in local memory 119 for performing the operations described herein. In some embodiments, the sanitization component 113 is part of the host system 110, an application, or an operating system.

In a non-limiting example, an apparatus (e.g., the computing system 100) can include a memory sub-system sanitization component 113. The memory sub-system sanitization component 113 can be resident on the memory sub-system 110. As used herein, the term "resident on" refers to something that is physically located on a particular component. For example, the memory sub-system sanitization component 113 being "resident on" the memory sub-system 110 refers to a condition in which the hardware circuitry that comprises the memory sub-system sanitization component 113 is physically located on the memory sub-system 110.

The term "resident on" can be used interchangeably with other terms such as "deployed on" or "located on," herein.

The memory sub-system sanitization component 113 can be configured to receive signaling indicative of performance of a sanitization operation for memory components of the memory sub-system and apply a sanitization voltage to a plurality of memory blocks. Embodiments provide that the sanitization voltage is applied to the plurality of memory blocks in parallel. As described above, the memory components can be memory dice or memory packages that form at least a portion of the memory device 130.

The memory sub-system sanitization component 113 can be further configured to apply the sanitization voltage to the plurality of memory blocks as only a single pulse (e.g., voltage pulse). The sanitization voltage, applied as a single pulse, is not required to be applied repeatedly (e.g., applied as a plurality of pulses) to sanitize the plurality of memory blocks. In some embodiments, the memory sub-system sanitization component 113 can enable a subset of memory blocks while disabling a different subset of memory blocks such that the enabled memory blocks receive the sanitization voltage. As such, the disabled different subset of memory blocks does not receive the sanitization voltage. Embodiments provide that the disabled different subset of memory blocks may include data that is not personal and/or confidential data (e.g., data that has been written to memory device by a memory device vendor). One or more embodiments provided that each the plurality of memory blocks can be enabled to receive the sanitization voltage.

Embodiments provide that the sanitization voltage is greater than an erase voltage for the memory blocks. Non-volatile memory cells can be programmed using program/erase cycles. Such a cycle might involve first erasing the memory cells as a block and then programming the memory cells (e.g., in pages). A typical erase operation may involve concurrently applying a number of erase voltage pulses to (e.g., across) each memory cell in each string in a block, while concurrently applying a common low voltage, such as a ground voltage, to all of the access lines. After each application of an erase voltage, an erase verify may be performed to determine whether the block is erased, for example, by determining if the threshold voltages (Vts) of the memory cells have reached an erase Vt level. If the block is erased, the erase operation is complete. Otherwise, the magnitude of voltage and/or the time duration of the erase pulse may be subsequently increased, and a subsequent erase verify may be performed after each erase pulse until the block is verified as erased.

However, memory cells can become unusable after experiencing a certain number of program/erase cycles and/or receiving application of high voltages. As such erase voltages as utilized for a program/erase cycles can have distribution from a low erase voltage (e.g., when the memory cells to be erased are relatively newer) to a high erase voltage (e.g., when the memory cells to be erased are relatively older). Because memory cells can become unusable after experiencing receiving application of high voltages, lower erase voltages across the erase voltage distribution are utilized to prolong the lifespan of the memory sub-system, while still erasing memory cells for the program/erase cycles.

The sanitization voltage can be applied by increasing a source line voltage for a plurality of memory blocks of the memory device to a sanitization voltage, while maintaining the access lines at ground voltage. As mentioned, embodiments provide that the sanitization voltage is greater than an erase voltage (e.g., an erase voltage for a program/erase cycle) of the plurality of memory blocks. In other words, the sanitization voltage is greater than each erase voltage across the erase voltage distribution of a memory subsystem. Because the sanitization voltage is greater than the erase voltage of the plurality of memory blocks, applying the sanitization voltage to the plurality of memory blocks degrades memory cells of the plurality of memory blocks more than applying the erase voltage to the plurality of memory blocks. In other words, increasing the source line voltage (while maintaining the access lines at ground voltage) for the plurality of memory blocks of the memory device to the sanitization voltage degrades a number of memory cells of the memory device more than an increase of the source line voltage (while maintaining the access lines at ground voltage) for the plurality of memory blocks of the memory device to the erase voltage. As used herein, "degrades" refers to a shortening of the lifetime of memory cells.

Figure 2:
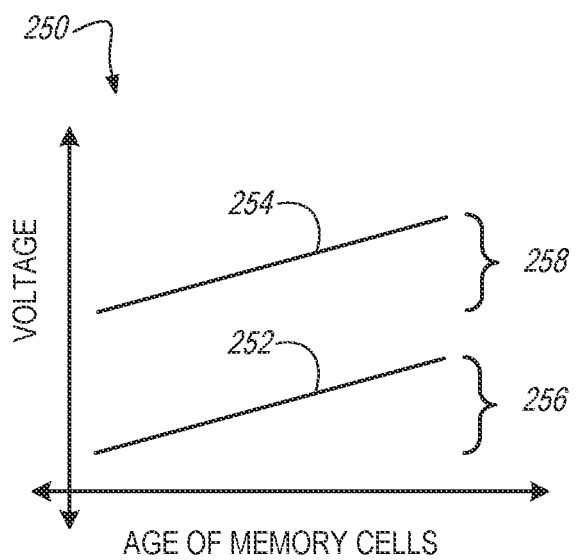
FIG. 2 is a plot of voltage vs age of memory cells in accordance with some embodiments of the present disclosure.

FIG. 2 is a plot 250 of voltage vs age of memory cells in accordance with some embodiments of the present disclosure. The plot 250 illustrates an erase voltage 252 and a sanitization voltage 254 for a plurality of memory blocks of a memory device. As shown in FIG. 2 and as previously mentioned, embodiments of the present disclosure provide that the sanitization voltage 254 is greater than the erase voltage 252 of the plurality of memory blocks.

FIG. 2 illustrates an erase voltage distribution 256 and a sanitization voltage distribution 258 for a plurality of memory blocks of a memory device. The erase voltage distribution 256 shows each erase voltage 252, including a lowest erase voltage utilized and a highest erase voltage utilized, across an entire lifetime of the plurality of memory blocks of the memory device range. The sanitization voltage distribution 258 shows each sanitization voltage 258, including a lowest sanitization voltage utilized and a highest sanitization voltage utilized, across an entire lifetime of the plurality of memory blocks of the memory device. One or more embodiments provide that at any age of the memory cells the sanitization voltage 254 is greater than the erase voltage 252. In other words, the lowest sanitization voltage 254 of the sanitization voltage distribution 258 is greater than the highest erase voltage 252 of the erase voltage distribution 256.

FIG. 2 illustrates that as the age of memory cells increases, the corresponding sanitization voltage 254 can also increase. However, embodiments are not so limited. One or more embodiments provide that the sanitization voltage 254 has a constant value. In other words, one or more embodiments provide that the sanitization voltage distribution 258 does not increase as the age of the memory cells increases. For embodiments where the sanitization voltage 254 has a constant value, this constant value is greater than the erase voltage 252 at any point in the erase voltage distribution 256. One or more embodiments provide that the sanitization voltage 254 is a constant value that is a maximum voltage that can be applied to a plurality of memory blocks of a memory device. The maximum voltage may have various values for different applications.

Figure 3:
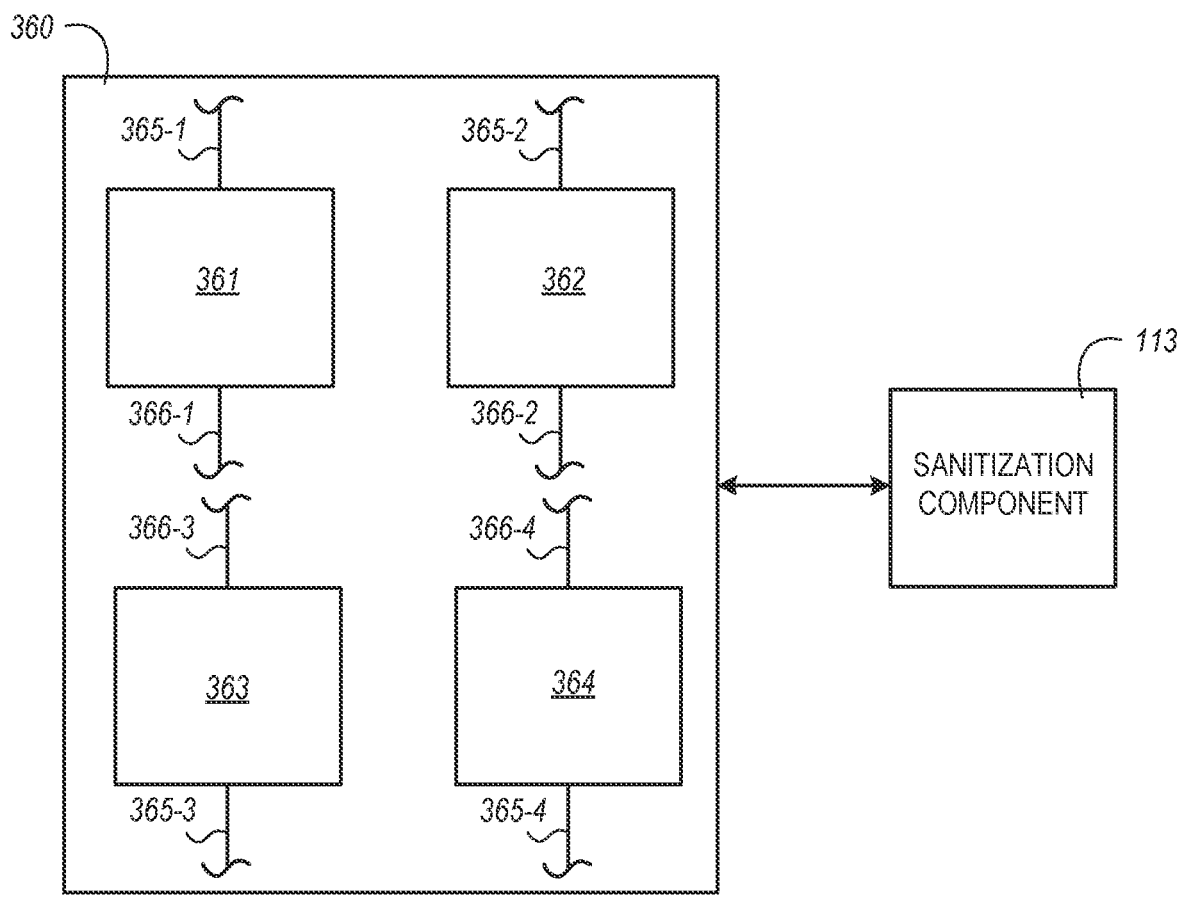
FIG. 3 illustrates an example of a portion of a memory device according to one or more embodiments of the present disclosure.

FIG. 3 illustrates an example of a portion of a memory device according to one or more embodiments of the present disclosure. As shown in FIG. 3, a memory device 360 can include a plurality of memory blocks 361, 362, 363, 364. While FIG. 3 illustrates four memory blocks 361, 362, 363, 364, embodiments are not so limited; various numbers of memory blocks can be utilized for different applications. In some embodiments, the plurality of memory blocks 361, 362, 363, 364 can include respective groups (e.g., strings) of series-coupled (e.g., one-transistor) non-volatile memory cells. The series-coupled memory cells in a string, for example, can be between a data line (e.g., a bit line) and a source. For example, the memory cells in a string may be coupled in series source to drain. Memory cells at respective locations in the strings, for example, may be commonly coupled to respective access lines, such as word lines.

Each of the plurality of memory blocks 361, 362, 363, 364 includes a respective source line 365-1, 365-2, 365-3, 365-4. While FIG. 3 illustrates one respective source line 365-1, 365-2, 365-3, 365-4 associated with each of the memory blocks 361, 362, 363, 364, embodiments are not so limited; various numbers of respective source lines can be utilized for different applications.

Each of the plurality of memory blocks 361, 362, 363, 364 includes a respective access line 366-1, 366-2, 366-3, 366-4. While FIG. 3 illustrates one respective access line 366-1, 366-2, 366-3, 366-4 associated with each of the memory blocks 361, 362, 363, 364, embodiments are not so limited; various numbers of respective access lines can be utilized for different applications.

One or more embodiments provide that a source line 365-1, 365-2, 365-3, 365-4 voltage for a plurality of memory blocks of the memory device can be increased to a sanitization voltage. One or more embodiments provide that increasing the source line voltage to the sanitization voltage can be performed in parallel for each of the plurality of memory blocks of the memory device. In other words, the sanitization voltage can be applied simultaneously to each of the plurality of memory blocks.

Embodiments provide that increasing the source line voltage to the sanitization voltage (e.g., applying the sanitization voltage to the plurality of memory blocks) is sufficient to erase any block of the memory device with only a single pulse. In other words, the increase of the source line voltage for the plurality of memory blocks to the sanitization voltage can remove all data from the plurality of memory blocks. As previously mentioned, the sanitization voltage is greater than an erase voltage of the plurality of memory blocks. As such, the increase of the source line voltage for the plurality of memory blocks of the memory device to the sanitization voltage can degrade a number of memory cells of the memory device more than an increase of the source line voltage for the plurality of memory blocks of the memory device to the erase voltage.

One or more embodiments provide that the sanitization component (e.g., the sanitization component 113) is configured to increase the source line voltage for the plurality of memory blocks of the memory device to the sanitization voltage a predetermined number of times. Configuring the sanitization component to increase the source line voltage for the plurality of memory blocks to the sanitization voltage the predetermined number of times can be utilized to limit the number of times that the sanitization voltage is applied to the plurality of memory blocks. As mentioned, application of the sanitization voltage can degrade the memory cells more than application of the erase voltage, for a number of instances the degradation caused by application of the sanitization voltage can be controlled by limiting the number of times the sanitization voltage can be applied during a lifetime of the memory device.

One or more embodiments provide that the predetermined number of times that the sanitization component is configured to increase the source line voltage for the plurality of memory blocks of the memory device to the sanitization voltage is from one to five. For example, the predetermined number of times that the sanitization component is configured to increase the source line voltage for the plurality of memory blocks of the memory device to the sanitization voltage can be one time, two times, three times, four times, or five times. One or more embodiments provide that once the predetermined number of times that the sanitization component is configured to increase the source line voltage for the plurality of memory blocks of the memory device has been achieved, then the source line voltage for the plurality of memory blocks cannot again be increased to the sanitization voltage. For instance, if the predetermined number of times is one time and the sanitization voltage has been applied one time to the plurality of memory blocks, then the sanitization voltage cannot again be applied to the plurality of memory blocks. Similarly, if the predetermined number of times is two times and the sanitization voltage has been applied two times to the plurality of memory blocks (e.g., where the sanitization voltage has been applied a first time, subsequently the plurality of memory blocks have been written to, and then the sanitization voltage has been applied a second time) then the sanitization voltage cannot again be applied to the plurality of memory blocks.

Figure 4:
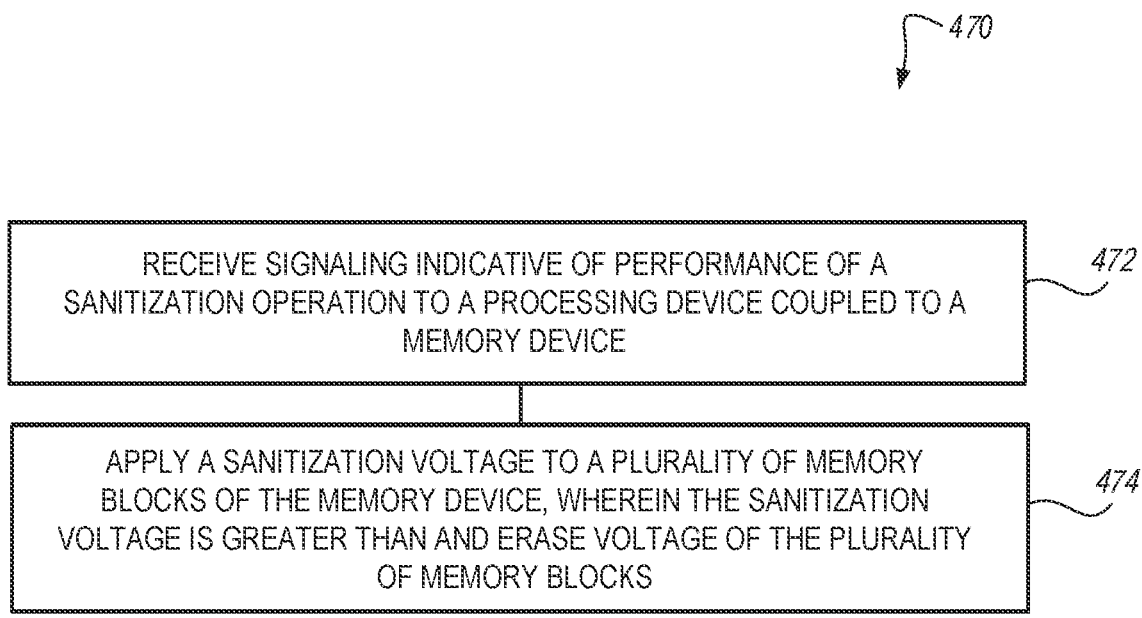
FIG. 4 is flow diagram corresponding to a method for memory sub-system sanitization in accordance with some embodiments of the present disclosure.

FIG. 4 is flow diagram corresponding to a method 470 for memory sub-system sanitization in accordance with some embodiments of the present disclosure. The method 470 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 470 is performed by the sanitization component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 472, signaling indicative of performance of a sanitization operation to a processing device coupled to a memory device can be received. The signaling indicative of performance of the sanitization operation can include enabling a plurality of memory blocks to receive the sanitization voltage.

At operation 474, a sanitization voltage can be applied to a plurality of memory blocks of the memory device, wherein the sanitization voltage is greater than an erase voltage of the plurality of memory blocks. As mentioned, applying the sanitization voltage to the plurality of memory blocks can sanitize the plurality of memory blocks.

In some embodiments, the method 470 can include that the sanitization voltage is applied to the plurality of memory blocks in parallel. For instance, the sanitization voltage can be applied to the plurality of memory blocks simultaneously.

In some embodiments, the method 470 can include that the sanitization voltage is applied as only a single pulse. In other words, the single pulse of the sanitization voltage can remove all data from the plurality of memory blocks of the memory device without a repeated application of the sanitization voltage. Embodiments provide that a single pulse of the sanitization voltage can be applied to the plurality of memory blocks of the memory device a predetermined number of times over the lifetime of memory device. The predetermined number of times that the sanitization voltage can be applied to the plurality of memory blocks of the memory device can be one time, two times, three times, four times, or five times.

In some embodiments, the method 470 can include that the plurality of memory blocks to which the sanitization voltage is applied comprises each memory block of the memory device. For example, the sanitization voltage can be applied to each memory block of the memory device in parallel (e.g., simultaneously). When the sanitization voltage is applied to each memory block of the memory device in parallel, all data is removed from each memory block of the memory device.

In some embodiments, the method 470 can include enabling a subset of memory blocks while disabling a different subset of memory blocks, wherein the enabled memory blocks receive the sanitization voltage. For instance, there can be situations where data is to be maintained on one or more memory blocks. As such, a subset of memory blocks can be disabled from receiving the sanitization voltage, while a different subset of memory blocks is enabled to receive the sanitization voltage. Because the subset of memory blocks that is disabled from receiving the sanitization voltage does not receive the sanitization voltage, data is maintained thereon.

Figure 5:
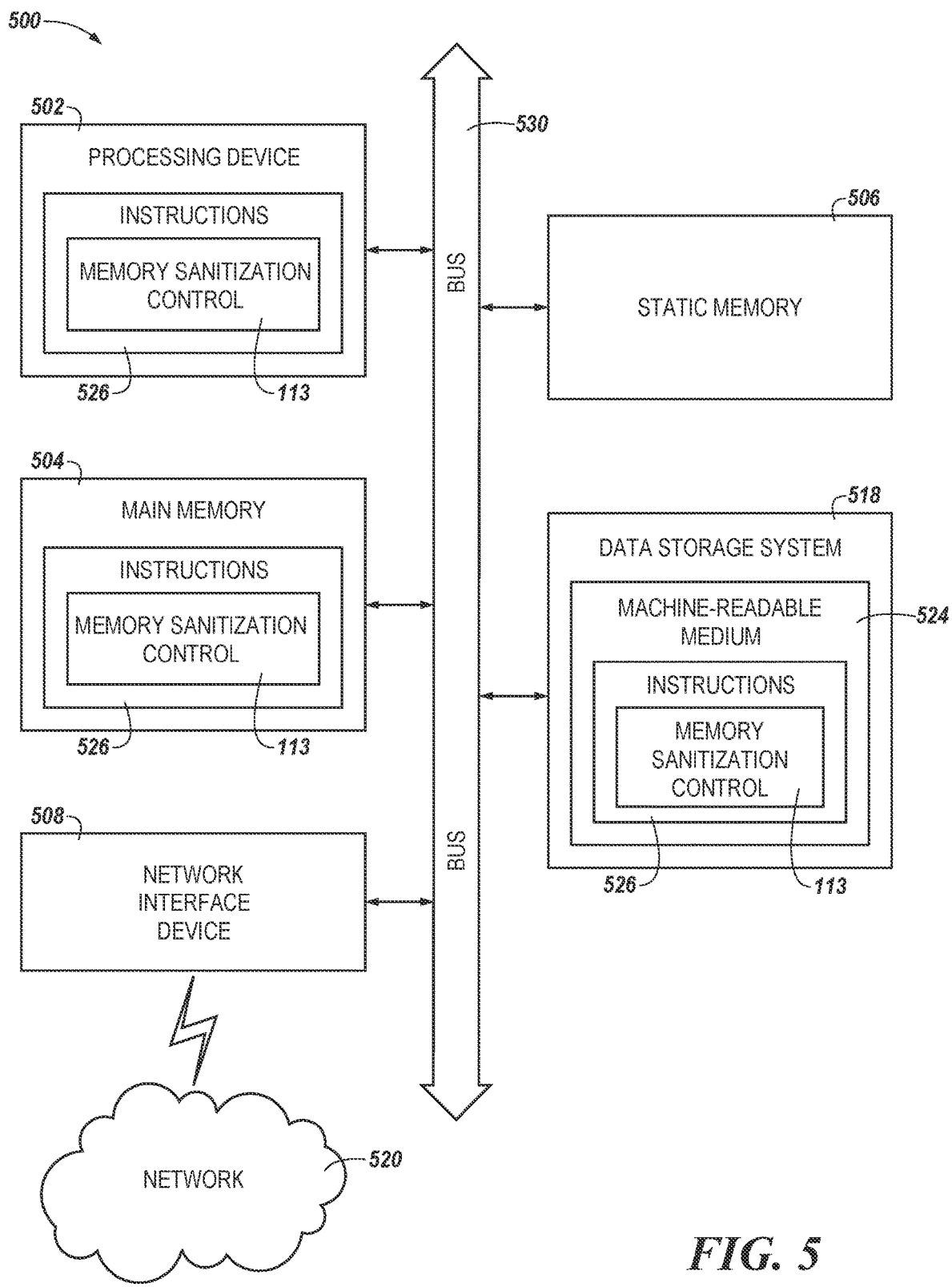
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the sanitization component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a sanitization component (e.g., the sanitization component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
    increasing a source line voltage for a plurality of memory blocks of a memory device to a sanitization voltage; and
    applying the sanitization voltage to the plurality of memory blocks of the memory device, wherein the sanitization voltage is greater than an erase voltage of the plurality of memory blocks.

2. The method of claim 1, wherein the sanitization voltage is applied to the plurality of memory blocks in parallel.

3. The method of claim 1, wherein the sanitization voltage is applied to the plurality of memory blocks as only a single pulse.

4. The method of claim 1, wherein the plurality of memory blocks comprise each memory block of the memory device.

5. The method of claim 1, further comprising enabling each of the plurality of memory blocks to receive the sanitization voltage.

6. The method of claim 1, further comprising enabling a subset of memory blocks while disabling a different subset of memory blocks, wherein the enabled memory blocks receive the sanitization voltage.

7. An apparatus, comprising:
    a memory device; and
    a controller coupled to the memory device and configured to:
        increase a source line voltage for a plurality of memory blocks of the memory device to a sanitization voltage that is greater than an erase voltage of the plurality of memory blocks of the memory device.

8. The apparatus of claim 7, wherein the source line voltage for the plurality of memory blocks of the memory device is increased to the sanitization voltage in parallel for each of the plurality of memory blocks of the memory device.

9. The apparatus of claim 7, wherein the sanitization voltage is sufficient to erase any block of the memory device with only a single pulse.

10. The apparatus of claim 7, wherein the increase of the source line voltage for the plurality of memory blocks of the memory device to the sanitization voltage degrades a number of memory cells of the memory device more than an increase of the source line voltage for the plurality of memory blocks of the memory device to the erase voltage.

11. The apparatus of claim 7, wherein the controller is configured to increase the source line voltage for the plurality of memory blocks of the memory device to the sanitization voltage a predetermined number of times.

12. The apparatus of claim 11, wherein the predetermined number of times is one.

13. The apparatus of claim 7, wherein the increase of the source line voltage for the plurality of memory blocks of the memory device to the sanitization voltage removes all data from the plurality of memory blocks of the memory device.

14. A non-transitory computer-readable storage medium comprising instructions that, when executed by a processing device, cause the processing device to:
    increase a source line voltage for a plurality of memory blocks to a sanitization voltage; and
    apply the sanitization voltage to the plurality of memory blocks each comprising subsets of an array of memory cells, wherein the sanitization voltage is greater than an erase voltage of the plurality of memory blocks.

15. The medium of claim 14, wherein the sanitization voltage is applied to the plurality of memory blocks in parallel.

16. The medium of claim 15, wherein the sanitization voltage is applied to the plurality of memory blocks as only a single pulse.

17. The medium of claim 14, wherein the processing device is to perform operations comprising enabling each of the plurality of memory blocks to receive the sanitization voltage.

18. The medium of claim 14, wherein the processing device is to perform operations comprising enabling each memory block of the plurality of memory components to receive the sanitization voltage.

19. The medium of claim 14, wherein the system comprises a mobile computing device.

20. The medium of claim 14, wherein the applying the sanitization voltage to the plurality of memory blocks removes all data from the plurality of memory blocks.

* * * * *